US012690133B2

(12) United States Patent
Chiu et al.

(10) Patent No.: US 12,690,133 B2
(45) Date of Patent: Jul. 21, 2026

(54) SYSTEM BOARD WITH STAGGERED POWER CONNECTORS AND POWER ADAPTERS FACILITATING COMPATABILITY WITH DIFFERENT CHASSIS

(71) Applicant: HEWLETT PACKARD ENTERPRISE DEVELOPMENT LP, Spring, TX (US)

(72) Inventors: Chui Ching Chiu, Taoyuan City (TW); Chih-Wei Chiang, Taoyuan City (TW); Kunhan Chen, Taipei City (TW)

(73) Assignee: Hewlett Packard Enterprise Development LP, Spring, TX (US)

( * ) Notice: Subject to any disclaimer, the term of this patent is extended or adjusted under 35 U.S.C. 154(b) by 12 days.

(21) Appl. No.: 18/906,772

(22) Filed: Oct. 4, 2024

(65) Prior Publication Data

US 2026/0101439 A1 Apr. 9, 2026

(51) Int. Cl.
| | |
|---|---|
| *H05K 1/14* | (2006.01) |
| *H01R 12/70* | (2011.01) |
| *H01R 12/71* | (2011.01) |
| *H05K 1/181* | (2026.01) |

(52) U.S. Cl.
CPC ......... *H05K 1/145* (2013.01); *H01R 12/7088* (2013.01); *H01R 12/716* (2013.01); *H05K 1/181* (2013.01); *H05K 2201/10189* (2013.01)

(58) Field of Classification Search
CPC ........ H05K 1/145; H05K 1/141; H05K 1/142; H05K 1/144; H05K 1/181; H05K 2201/10189; H01R 12/7088; H01R 12/716
See application file for complete search history.

(56) References Cited

U.S. PATENT DOCUMENTS

| | | | | |
|---|---|---|---|---|
| 9,292,054 B2 * | 3/2016 | Cai | | H05K 7/1487 |
| 2012/0026710 A1 * | 2/2012 | Li | | H05K 1/141 |
| | | | | 361/803 |
| 2026/0005456 A1 * | 1/2026 | Sun | | H01R 12/7088 |
| 2026/0020157 A1 * | 1/2026 | Liu | | H02M 7/003 |

OTHER PUBLICATIONS

Open Compute Project, "Full Width HPM Form Factor (M-FLW) Base Specification," Part of the Datacenter-Modular Hardware Systems (DC-MHS) Rev 1.0 Family, Version 1.1 RC2, Apr. 2, 2024, 78 pages.

(Continued)

*Primary Examiner* — Robin J Mishler
(74) *Attorney, Agent, or Firm* — Jones Robb, PLLC

(57) ABSTRACT

A system board for an information processing device includes a printed circuit board (PCB), electronic components formed in and/or mounted to the PCB, a first power connector mounted to the PCB, and a second power connector mounted to the PCB. The PCB has a stepped rear edge comprising at least first step and a second step, the first step being farther rearward than the second step. The first power connector is mounted at the first step, and the second power connector is mounted at the second step, such that the first power connector is a predetermined distance farther rearward than the second power connector.

20 Claims, 14 Drawing Sheets

(56)　　　　　　　References Cited

OTHER PUBLICATIONS

Open Compute Project, "Modular Scalable DeNsity Optimized HPM Form Factor (M-SDNO) Base Specification," Part of the Datacenter-Modular Hardware Systems (DC-MHS) Rev 1.0 Family, Version 0.9 RC2, Apr. 18, 2024, 130 pages.
Open Compute Project, "Partial Width, Density Optimized HPM Form Factor (M-DNO) Base Specification," Part of the Datacenter-Modular Hardware Systems (DC-MHS) Rev 1.0 Family, Version 1.1 Release Candidate 2, Mar. 14, 2024, 83 pages.

* cited by examiner

1102

SYSTEM BOARD WITH STAGGERED POWER CONNECTORS AND POWER ADAPTERS FACILITATING COMPATABILITY WITH DIFFERENT CHASSIS

INTRODUCTION

Information processing systems, such as servers and networking devices, often have a system board (e.g., motherboard, host processor module (HPM, etc.) which carries one or more processors and various other electronic components. The information processing systems may also include one or more power supply units (PSUs) to provide power to the system board and other system components. In enterprise information processing systems, two or more PSUs are often provided to ensure redundancy. Furthermore, enterprise information processing systems, a PSU often includes an edge connector (called herein a PSU edge connector) and the system board often comprises a slot-style power connector (called herein a "power connector") configured to removably receive the PSU edge connector of the PSU. For example, in many enterprise information processing devices, the PSUs are installed in the space between the rear edge of the system board and a rear panel of the system's chassis, and the power connectors of the system board are arranged on a rear edge thereof such that the PSU edge connectors may blind-mate with the power connectors during insertion of the PSU into the system.

BRIEF DESCRIPTION OF THE DRAWINGS

The present disclosure can be understood from the following detailed description, either alone or together with the accompanying drawings. The drawings are included to provide a further understanding of the present disclosure and are incorporated in and constitute a part of this specification. The drawings illustrate one or more examples of the present teachings and together with the description explain certain principles and operations. In the drawings.

DETAILED DESCRIPTION

Figure 1:
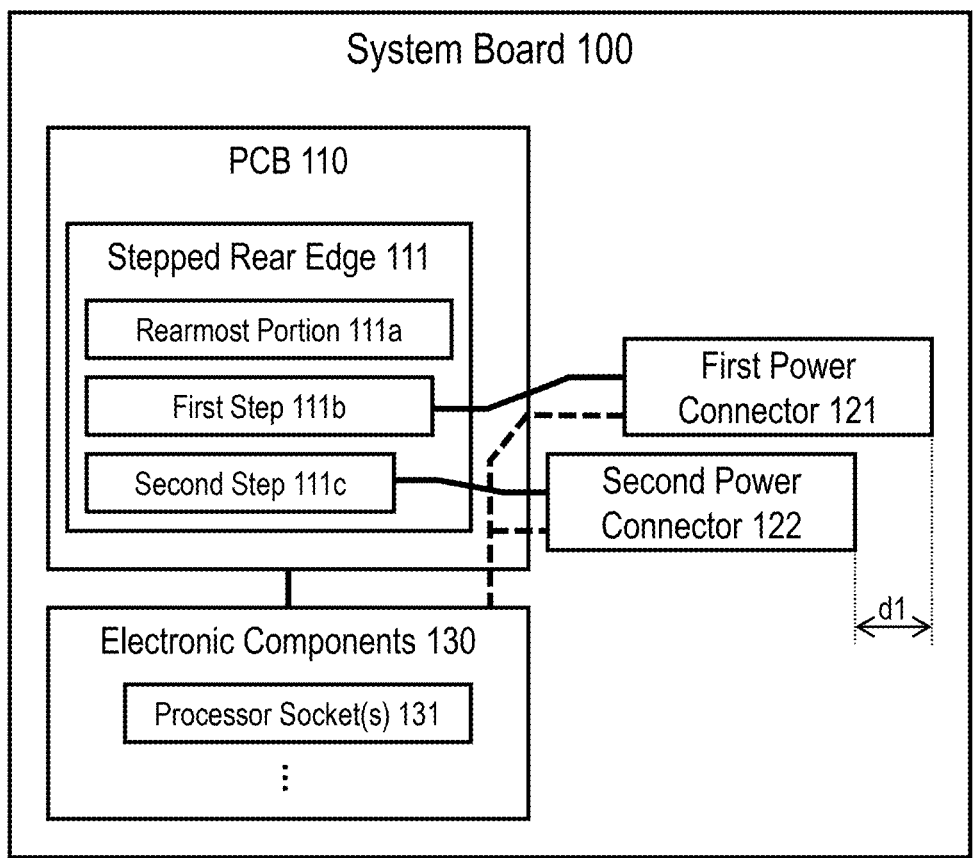
FIG. 1 is a block diagram illustrating an example system board for use in an information processing system.

Manufacturers of information processing devices often produce multiple different types of systems to meet different customer needs. These different systems will often have different components relative to one another. In particular, it is common for different systems to each have their own unique chassis and their own unique system board design. However, system boards can be relatively costly to design, and thus designing and producing multiple different system boards for various systems can be very costly. Accordingly, it may be desirable, under some circumstances, to share the same system board design among multiple systems, as this can reduce development, manufacturing, and logistical costs.

However, in some cases, it may be difficult to use the same system board design in two different systems which have different sizes of chassis. A system board designed to work in a system having one size of chassis may not work in another system having a different size of chassis. This may be the case even if the system board of a first system physically fits within the chassis of a second system, as the different chassis sizes may result in the connectors of the system board having different relative locations in the system which can inhibit connection of those connectors with the intended components.

For example, suppose that a system board designed for use in a system with a shorter chassis is installed in a system having a longer chassis. Although the system board of the shorter system will fit in the longer system, the relative locations of the power connectors thereof may change. Specifically, the power connectors of the system board were arranged with the shorter chassis in mind such that the distance between the rear panel of the shorter chassis and the power connectors was about equal to the length of the PSUs. This allows the PSUs to mate with the power connectors when installed. However, when that same system board is installed in a longer chassis, the spacing between the power connectors of the system board and the rear panel will be increased, due to the greater length of the chassis. As a result, the distance between the power connector and rear panel will exceed the PSU length, and the PSU will not be able to properly mate with the power connectors. Thus, the system board of the shorter system would likely not be compatible with the longer system.

Similarly, a system board designed for the longer system may not be compatible with the shorter system. The power connectors of this system board will have been arranged so that the distance between them and the rear panel of the longer chassis is about equal to the PSU length. But when installed in the in the shorter system, the power connectors of the system board will be located closer to the rear panel, due to the decreased chassis length. Consequently, the distance between the power connectors and the rear panel will be less than the PSU length, and therefore when the PSU is mated with the power connectors it will stick out of the rear panel of the chassis. This is undesirable because it can cause the system to no longer fit within its desired footprint. Thus, the system board of the longer system would likely not be compatible with the shorter system.

To address these and other issues, disclosed herein are information processing systems which utilize system boards having a staggered power connector layout, together with various adapters, which can allow the same system board to be usable in multiple differently configured systems, including systems having different chassis lengths. In examples disclosed herein, the rear edge of the system board has a stepped or tiered configuration comprising at least two steps, with a first step being located farther rearward than a second step. A first power connector is disposed at the first step while a second power connector is disposed at the second step. This staggered arrangement of the power connectors, together with use of various adapters, allows for a variety of installation options for PSUs which can accommodate different system configurations, including different chassis lengths. Thus, the same system board design may be reused in multiple systems, which can reduce development, manufacturing, and logistical costs.

In some examples, the location of the first power connector on the system board may be set such that, if the system board is installed in a longer chassis, then a distance between the first power connector and a rear panel is approximately equal to a length of a PSU. Consequently, when the system board is used in the longer chassis, a first PSU may plug directly into the first power connector of the system board. On the other hand, the location of the second power connector on the system board may be set such that, if installed in a shorter chassis, then a distance between the second power connector and a rear panel is approximately equal to a length of a PSU. Consequently, when the system board is used in the shorter chassis, a first PSU may plug directly into the second power connector of the system board. Thus, the same system board can be used in multiple different systems having different chassis lengths.

In some cases, it may be desired to include a second PSU in the system (e.g., for redundancy). Examples disclosed herein may accommodate the inclusion of a second power supply, while still allowing the system board to be used in different system configurations, including in differently sized chassis. The addition of a second PSU will be described for both the aforementioned longer chassis and the shorter chassis in turn below.

In the longer chassis, a distance between the second power connector and the rear panel may exceed the length of the PSU, due to the second step being farther forward than the first step. Therefore a second PSU may not be able to plug directly into the second power connector. However, in some examples, an adapter board may be positioned between the second power connector and the PSU. The adapter board may have an edge connector at one end to mate with the second power connector, and a slot connector at the other end to mate with the PSU edge connector of the second PSU. Thus, the adapter allows the second connector to be indirectly connected to the second power connector. Accordingly, two PSUs can be installed in the longer chassis, with one PSU plugging directly into the first power connector and the other PSU plugging indirectly into the second power connector via the adapter board.

In the shorter chassis, the distance between a rear panel and the first power connector may be less than a length of the PSU, and therefore it may not be possible to plug a second PSU directly into the first power connector. However, a second PSU can be accommodated in the shorter chassis in at least two arrangements described below.

In one arrangement, a second PSU may be positioned laterally adjacent to the system board and may be coupled to a first bridge adapter, which is in turn coupled to the first power connector. The bridge adapter may have a slot connector at one end to mate with the PSU edge connector of the second PSU, an edge connector at another end to mate with the first power connector, and flexible wires connecting the two ends together. In this manner, two PSUs can be installed in the shorter chassis, with one PSU plugging directly into the second power connector and the other PSU plugging indirectly into the first power connector via the bridge adapter.

In a second arrangement, two system boards are provided in the system chassis, rather than one, with both having the same staggered power connector arrangement. A first PSU is connected directly to the second power connector of one system board, and a second PSU is connected directly to the second power connector of the other system board. Then, a second bridge adapter may be used to connect the two first power connectors of the two system boards to one another, thereby unifying the power domains of both system boards. The second bridge adapter may comprise two edge connectors and flexible wires connecting the two edge connectors together. One edge connector is plugged into the first power connector of one system board and the other edge connector is plugged into the first power connector for the other system board. In this manner, two PSUs can be installed in the shorter chassis, with both the first PSU and the second PSU being directly coupled to the second power connectors of the system boards, while the system boards are connected together via the bridge and the first power connectors.

These and other examples will be described in greater detail below in relation to FIGS. 1-14.

Figure 2:
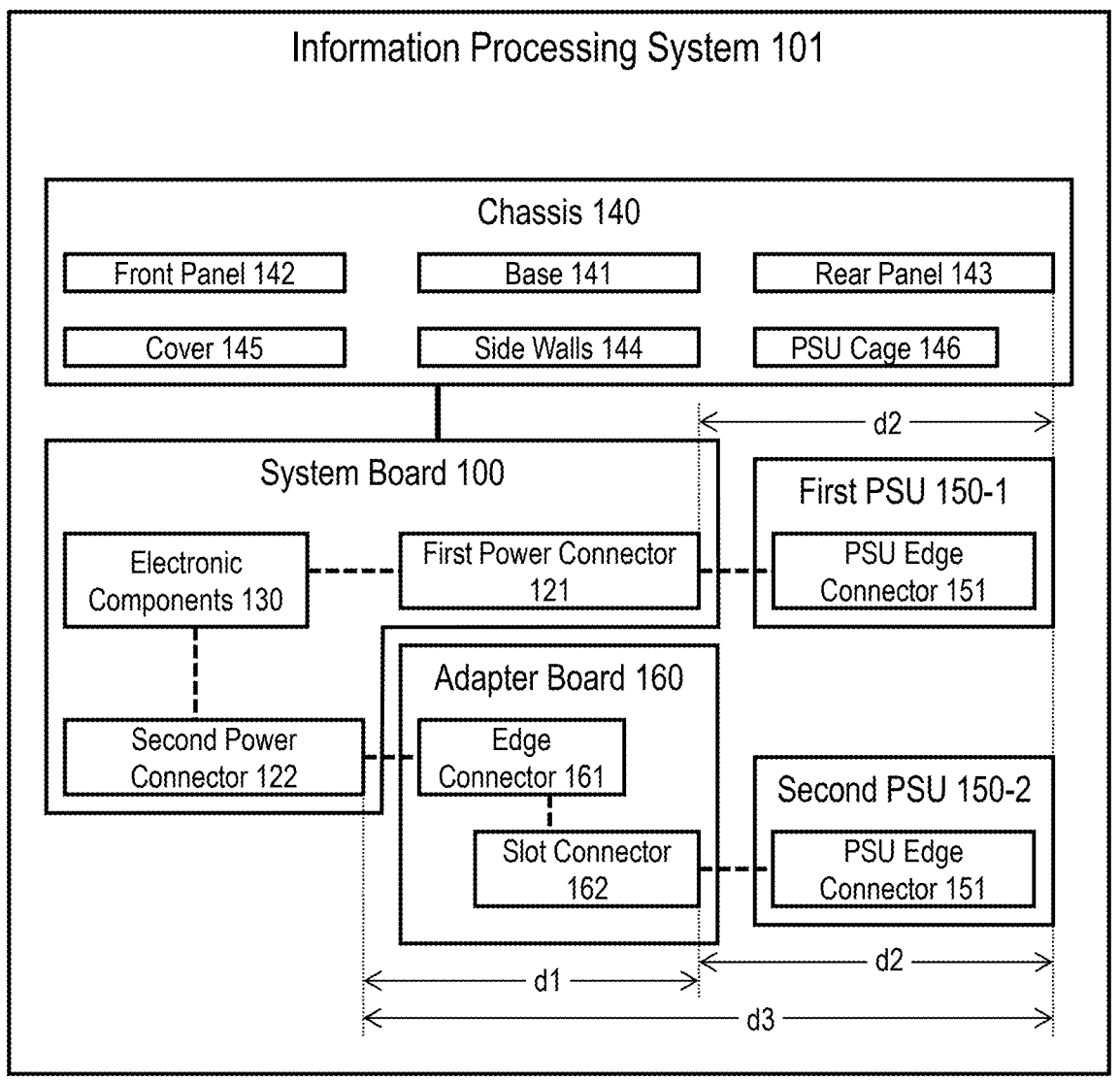
FIG. 2 is a block diagram illustrating a first example information processing system comprising the system board of FIG. 1.
Figure 3:
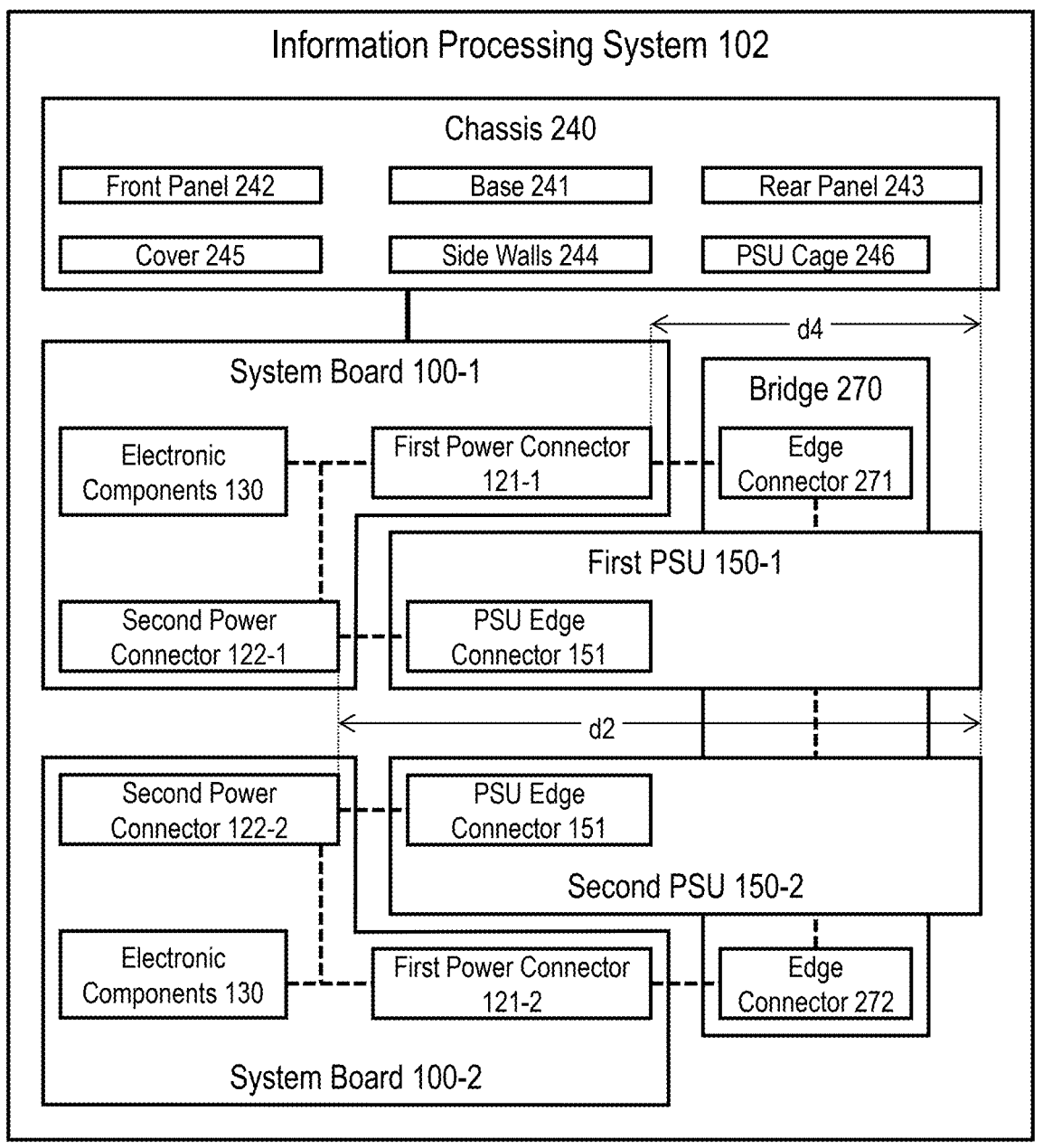
FIG. 3 is a block diagram illustrating a second example information processing system comprising the system board of FIG. 1.
Figure 4:
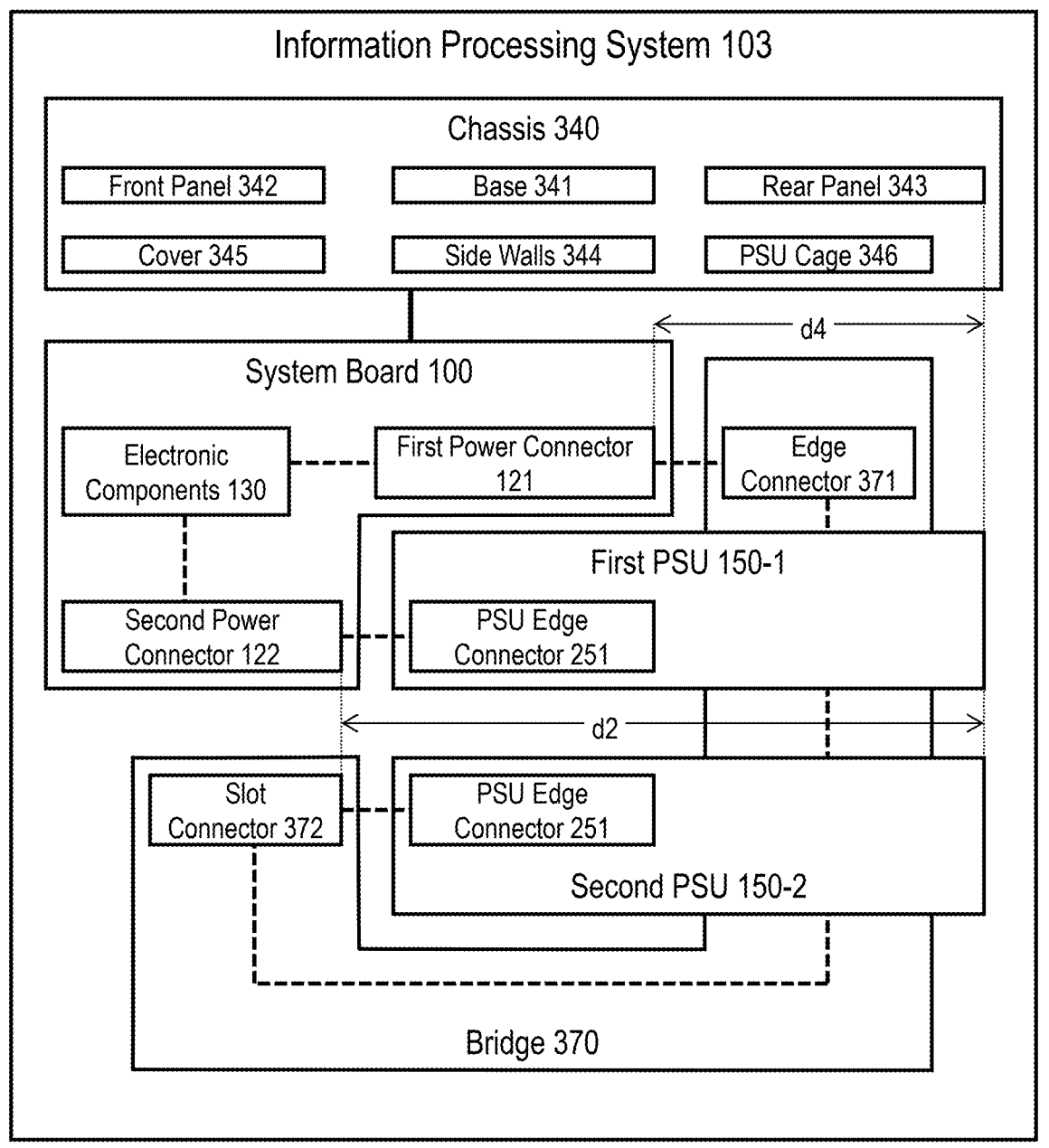
FIG. 4 is a block diagram illustrating a third example information processing system comprising the system board of FIG. 1.

FIG. 1 illustrates an example system board 100. FIGS. 2-4 illustrates example information processing systems 101, 102, and 103 each of which comprises one or more of the system boards 100. FIGS. 1-4 are schematic in nature and are not intended to illustrate shapes, sizes, spatial relationships, or other structural details accurately or to scale, unless otherwise noted herein. Components which are not illustrated in FIGS. 1-4 may also be included in some examples disclosed herein, or one or more components illustrated in FIGS. 1-4 may be omitted from some examples disclosed herein. In FIGS. 1-4, solid lines extending between blocks indicate physical engagement or attachment between the components represented by the blocks, whereas dashed lines extending between blocks indicate electrical connections between the components represented by the blocks.

The system board 100 may be a motherboard, host-processor module (HPM), or other system board of an information processing system. As shown in FIG. 1, the system board 100 comprises a printed circuit board (PCB) 110 and various components mounted to the PCB 110 including electronic components 130, a first power connector 121, and a second power connector 122. These components of the system board 100 will be described in turn below.

The PCB 110 comprise a circuit board which has a front edge (not illustrated), a stepped rear edge 111, and side edges (not illustrated) connecting the front edge to the stepped rear edge 111. The stepped rear edge 111 has a rearmost portion 111a, which is the portion of the rear edge 111 which is located the farthest rearward out of all the other portions of the stepped rear edge 111. The stepped rear edge 111 also has at least two steps which are positioned at multiple different locations along a front-to-rear dimension of the system board in a staggered/stepped/tiered fashion. These steps include at least a first step 111b and a second step 111c. The first step 111b is located farther rearward than the second step 111b. In some examples, the first step 111b includes the farthest rearward portion of the rear edge 111, in which case the first step 111b and the rearmost portion 111a may be one and the same. In other examples, some other portion of the rear edge 111 may be located farther rearward than the first step 111b, in which case the first step 111b and the rearmost portion 111a may be distinct from one another.

The electronic components 130 may include any electronic components which may be included in, or mounted on, system boards of information processing devices, as would be familiar to those of ordinary skill in the art. Among these components 130 may be one or more processor sockets 131, which may have, or be configured to receive, a processor mounted therein. The electronic components 130 may also include memory sockets (e.g., DIMM sockets) which may have, or be configured to receive, memory modules (e.g., DIMMs). The electronic components 130 may also include voltage regulation modules (VRMs), system controllers (e.g., a baseboard management controller (BMC), communication busses, etc., as would be familiar to those of ordinary skill in the art.

The PCB 110 also includes power rails, which comprise conductive pathways (represented, in part, by portions of the dashed lines in FIG. 1 which extend through the PCB 110) which are configured to convey electrical power signals between the first and second power connectors and the electronic components 130. The electrical connections are illustrated by a single dashed line for convenience, but it should be understood that there may be multiple distinct power rails, in some examples, such as a 12V power rail, a GND (0V) power rail, a 5V or standby power rail, etc. The power rails may also include various passive or active electrical components to condition, regulate, or otherwise control the power delivered along the rails.

The first power connector 121 may be mounted to the system board 110 at the first step 111b of the stepped rear edge 111, while the second power connector 122 may be mounted to the system board 110 at the second step 111c of the stepped rear edge 111. In some examples, the first and second power connectors 121 and 122 are straddle-mounted to the rear edge 111. In other examples, the first and second power connectors 121 and 122 are mounted to a face of the PCB 110 at positions adjacent to the rear edge 111. Because the first step 111b and the second step 111c are staggered relative to one another, the first power connector 121 and the second power connector 122 are also staggered relative to one another along the front-to-rear direction. Specifically, a rearmost side of the first power connector 121 is located a distance d1 farther rearward than a rearmost side of the second power connector 122.

The first and second power connectors 121 and 122 each comprise a slot-style connector which is configured to receive the PSU edge connector of a PSU. For example, the connectors 121 and 122 may each be configured to receive an M-CRPS edge connector of a PSU having the Modular Hardware System-Common Redundant Power Supply (M-CRPS) form factor. The connectors 121 and 122 may include power pins which are connected to the power rails of the PCB 110 and which exchange power signals with the PSUs when mated therewith. The connectors 121 and 122 may also include various sideband pins which are connected to communication paths in the PCB 110 and which exchange sideband signals with the PSUs when mated therewith.

Turning now to FIGS. 2-4, the usage of the system board 100 in various example information processing systems will be described.

As shown in FIG. 2, the system board 100 may be used in a first information processing system 101. The information processing system 101 comprises a chassis 140, the system board 100 installed in the chassis 140, first and second PSUs 150-1 and 150-2 (collectively PSUs 150), and an adapter board 160.

The chassis 140 may include a housing/enclosure which supports and houses the other components of the system 101, as well as various internal support structures to support those components. For example, the chassis 140 comprises a base 141, a front panel 142, and a rear panel 143, two side walls 144, and a cover 142, which together form a housing of the system, as is familiar to those of ordinary skill in the art. The front panel 142, rear panel 143, and side walls 144 are all perpendicular to the base 141. The cover 142 is parallel to the base 141 and may be fully or partially removable or openable to allow access to the interior of the chassis 140. The front panel 142 and rear panel 143 are disposed opposite one another, with the side walls 144 being perpendicular to and extending between the front panel 142 and the rear panel 143. A front-to-rear direction corresponds to the direction that the side walls 144 extend from the front panel 142 to the rear panel 143. The front panel 142 and the rear panel 143 may include airflow openings to allow airflow through the chassis, as well as electrical connectors or other ports. In addition, various bays may be provided at the front panel 142 and/or the rear panel 143 to allow for the removable installation of removable modules in the system, such as storage drives and PSUs. In some cases, portions of these removable modules may become part of the front panel 142 or the rear panel 143 when installed in the system (i.e., neither the front panel 142 nor the rear panel 143 is necessarily formed from a single monolithic structure).

In examples disclosed herein, the rear panel 143 comprises the panel of the chassis 140 through which the PSUs 150 are installed in the system 101. In particular, the chassis 140 comprises a PSU cage 146 which comprises at least two bays configured to removably receive and support the PSUs 150, respectively. The PSU cage 146 is disposed adjacent to the rear panel 143 such that the PSUs 150 are inserted through openings in the rear panel into the bays of the PSU cage 146, and once the PSUs 150 are so installed the rear sides of the PSUs 150 become themselves part of the rear panel 143 and are aligned with the rest of the rear panel 143.

The PSUs 150 each comprise a PSU edge connector 151. This is a card-edge style of connector (sometimes called a "gold finger connector," "PCB edge connector," or "edge connector"), which is formed in a protruding edge of a PCB of the PSU 150. The PCB of the PSU 150 is oriented parallel to the system board 100 when the PSU 150 is installed in the PSU cage 146. The PSU edge connector 151 has a form factor complementary to that of the first and second power connectors 121 and 122, such that the first and second power connectors 121 and 122 can mate with the PSU edge connectors 151 to communicably connect the PSUs 150 to the system board 100. For example, the PSU edge connectors 151 and the power connectors 121 and 122 may each have an M-CRPS form factor.

As shown in FIG. 2, the system board 100 is supported by the chassis 140. Moreover, the system board 100 is arranged in the chassis 140 such that the first power connector 121 is aligned with one bay of the PSU cage 146 while the second power connector 122 is aligned with another bay of the PSU cage 146. Furthermore, the first power connector 121 is positioned a distance d2 from the rear panel 143, whereas the second power connector 122 is positioned a distance d3 from the rear panel 143, wherein d3=d2+d1.

The distance d2 is approximately the same as the length of each of the PSUs 150. More specifically, in some examples the length of each PSU 150 may be equal to d2 plus the depth to which the edge connector 151 is insertable into the slot of a power connector such as the power connector 121. In this context, the "length" of the PSU refers to the distance from a rear wall of the PSU 150 (excluding protrusions such as handle, levers, etc.) to the front edge of the edge connector 151. Accordingly, because the gap between the rear panel 143 and the first power connector 121 is approximately the same length as the PSU 150 (less the insertion depth of the connector 151), when the first PSU 150-1 is inserted into the PSU cage 146, a PSU edge connector 151 of the first PSU 150-1 may mate directly with the first power connector 121.

However, when the second PSU 150-2 is inserted into the PSU cage 146, a PSU edge connector 151 of the second PSU 150-2 cannot mate directly with the second power connector 122, because the distance d3 exceeds the length of the PSUs 150. Thus, the adapter board 160 may be interposed between the second power connector 122 and the second PSU 150-2. The adapter board 160 has an edge connector 161 and a slot connector 162. The edge connector 161 of the adapter board 160 has a form factor complementary to that of the second power connector 122, while the slot connector 162 has a form factor complementary to that of the PSU edge connector 151. For example, the edge connector 161 and slot connector 162 may each have an M-CRPS form factor. The adapter board 160 is dimensioned such that, when the edge connector 161 is mated with the second power connector 122, the slot connector 162 is the distance d2 from the rear panel 143. In other words, the rear side of the slot connector 162 is the distance d1 from the rear side of the second power connector 122. Thus, the rear edge of the slot connector 162 is aligned with rear edge of the first power connector 121. Accordingly, the slot connector 162 is positioned to be able to receive the PSU edge connector 151 of the second PSU 150-2. In other words, the adapter 160 is able to span the gap between the second power connector 122 and the PSU edge connector 151.

As shown in FIG. 3, the system board 100 may also be used in a second information processing system 102. The information processing system 102 comprises a chassis 240, two instances of the system board 100 (i.e., system boards 100-1 and 100-2) installed in the chassis 240, two PSUs 150, and a bridge 270.

The chassis 240 comprises a front panel 242, a base 241, a rear panel 243, a cover 245, side walls 244, and a PSU cage 246. These components may be similar to the similarly named the components of the chassis 140 described above, except that in some examples the chassis 240 may be shorter in the front-to-rear direction than the chassis 140.

The PSUs 150 may be the same as the PSUs 150 described above.

The two system boards 100 include a first system board 100-1 and a second system board 100-2. The system boards 100-1 and 100-2 may be identical to one another.

In some examples, the system boards 100-1 and 100-2 are vertically stacked atop one another within the chassis 240. For example, the chassis 240 may have a height of 2 U (U referring to a "rack unit," which is a standard unit of height for rack-mountable information processing devices), with each system board 100 having approximately 1 U of vertical space within the chassis allocated thereto. In some examples, the first power connector 121-1 of the first system board 101-1 is vertically aligned with the first power connector 121-2 of the second system board 101-2, whereas the second power connector 122-1 of the first system board 101-1 is vertically aligned with the second power connector 122-2 of the second system board 101-2.

In other examples, the system boards 100-1 and 100-2 are disposed horizontally adjacent one another, such as front-to-rear adjacent or side-to-side adjacent.

In the second system 102 of FIG. 3, the chassis 240 is shorter than the chassis 140, and therefore the rear panel 243 is closer to the rear edges of the system boards 100 than is the case in the system 101. Thus, in the system 102, instead of the first power connectors 121 being the distance d2 from the rear panel 243, the second power connectors 122 are located the distance d2 from the rear panel 243. Accordingly, in this example, the PSUs 150, which are approximately d2 in length, are able to mate directly with the second power connectors 122. More specifically, the PSU edge connector 151 of the first PSU 150-1 mates with the second power connector 122-1 of the system board 100-1, while the PSU edge connector 151 of the second PSU 150-2 mates with the second power connector 122-2 of the system board 100-2.

In this example, the first power connectors 121-1 and 121-2 are located a distance d4 from the rear panel 243, wherein d4 is less than d2. Thus, a PSU cannot mate directly with the first power connectors 121. However, in this example, a first adapter bridge 270 is mated to the first power connectors 121 of the system boards 100. The bridge 270 comprises an edge connector 271 at one end thereof, another edge connector 272 at the opposite end thereof, and flexible wires connecting the edge connector 271 to the edge connector 272. The edge connector 271 is mated with the first power connector 121-1 of the first system board 100-1, while the edge connector 272 is mated with the first power connector 121-2 of the second system board 100-2. The edge connectors 271 and 272 may mimic the PSU edge connectors 151 in form factor. In some examples, the edge connectors 271 and 272 may have an M-CRPS form factor.

By connecting the bridge 270 to the first power connector 121-1 and the first power connector 121-2, the power domains of the system boards 100-1 and 100-2 are unified into a single power domain. Thus, if one of the PSUs 150 were to fail, the other PSU 150 would be able to continue providing power to both of the system boards 100-1 and 100-2, ensuring full redundancy for the power supply. For example, if the first PSU 150-1 were to fail, then the second PSU 150-2 could supply power to the system board 100-1 via this path: from the PSU 150-2 to the second power connector 122-2 of the system board 100-2, from there to the power rails of the system board 100-2, from there to first power connector 121-2, from there to the bridge 270, and from there to the first power connector 121-1 of the system board 100-1. Similarly, if the second PSU 150-2 were to fail, then the first PSU 150-1 could supply power to the system board 100-1 via this path: from the PSU 150-1 to the second power connector 122-1 of the system board 100-1, from there to the power rails of the system board 100-1, from there to first power connector 121-1, from there to the bridge 270, and from there to the first power connector 121-2 of the system board 100-2.

In some examples of system 102 in which the system boards 100 are vertically stacked, the first power connectors 121-1 and 121-2 are vertically aligned with one another, and therefore the bridge 270 may extend vertically therebetween in the shape of a U or C. In examples of the system 102 where the system boards 100 are horizontally aligned, the first power connectors 121 thereof may be spaced apart from one another in the same vertical level, and thus the bridge 270 may extend horizontally therebetween, for example passing over or under the system boards 100 and/or over or under the PSUs 150.

As shown in FIG. 4, the system board 100 may also be used in a third information processing system 103. The information processing system 103 comprises a chassis 340, the system board 100 installed in the chassis 340, two PSUs 150, and a bridge 370.

The chassis 340 comprises a front panel 342, a base 341, a rear panel 343, a cover 345, side walls 344, and a PSU cage 346. These components may be similar to the similarly named the components of the chassis 140 described above, except that in some examples the chassis 340 may be shorter in the front-to-rear direction than the chassis 140. Furthermore, in some examples, the chassis 340 can be wider than the chassis 240.

The PSUs 150 may be the same as the PSUs 150 described above.

This example system 103 may be similar to the system 102 of FIG. 3 in that the rear panel 343 is closer to the rear edge 111 of the system board 100 than is the case in the system 101, and therefore in the system 103 the second power connector 122 is the distance d2 from the rear panel 343, and the first power connector 121 is the distance d4<d2 from the rear panel 343. Accordingly, as in the system 102, in the system 103 the PSUs 150 cannot be directly connected to the first power connector 121 and instead the first PSU 150-1 is connected directly to the second power connector 122.

Unlike the system 102, in the system 103 there are not necessarily two system boards 100, and the second PSU 150-2 is not connected directly to another system board 100. Instead, the second PSU 150-2 is connected to a second adapter bridge 370, which is in turn connected to the system board 100. The bridge 370 comprises an edge connector 371 at one end, a slot connector 372 at the opposite end, and flexible wires connecting the edge connector 371 and slot connector 372 together. The edge connector 371 is connected to first power connector 121 of system board 100, and the slot connector 372 is connected to the PSU edge connector 151 of the second PSU 150-2. The edge connector 371 may mimic the PSU edge connectors 151 in form factor, while the slot connector 372 may mimic the first and second power connectors 121 and 122 in form factor. In some examples, the connectors 371 and 372 may have an M-CRPS form factor.

In some examples, the second PSU 150-2 may be positioned laterally adjacent to (horizontally aligned with) the first PSU 150-1. Some examples of the chassis 340 may be wider in a lateral direction than some examples of the chassis 240 in order to allow room for the second PSU 150-2 to be so positioned. In some examples, the second PSU 150-2 may be positioned vertically adjacent to (vertically aligned with) the first PSU 150-1.

The examples systems 101, 102, and 103 explained above illustrate some of the ways in which the system board 100 can, together with various adapters (e.g., adapter board 160, bridge 270, and bridge 370), be used in a variety of different system configurations, including in systems having different chassis sizes. For example, the system 101 has a longer chassis while the systems 102 or 103 have a shorter chassis, and yet the system board 100 is compatible with each of these systems.

Figure 5:
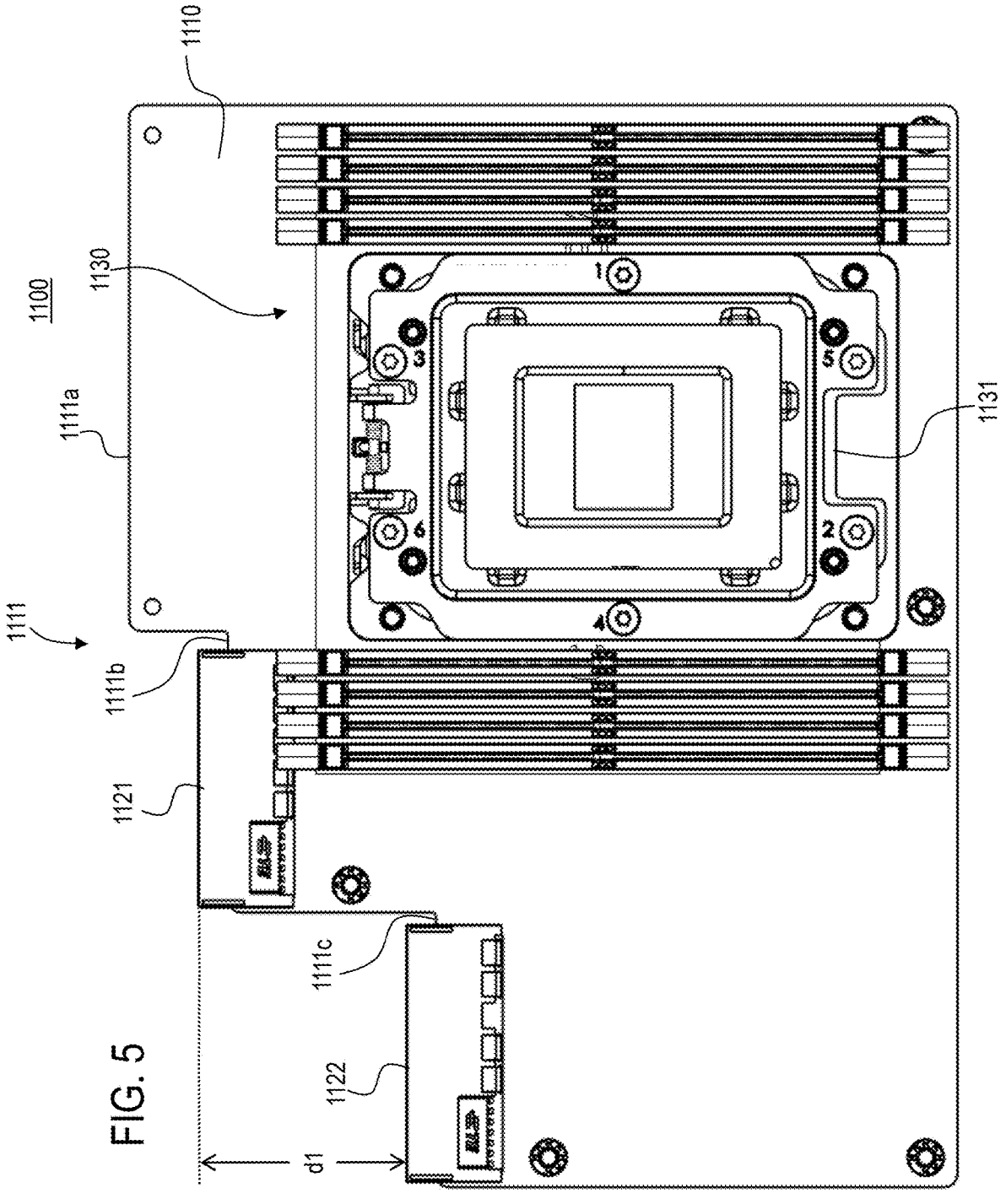
FIG. 5 is a perspective view of another example system board.
Figure 6:
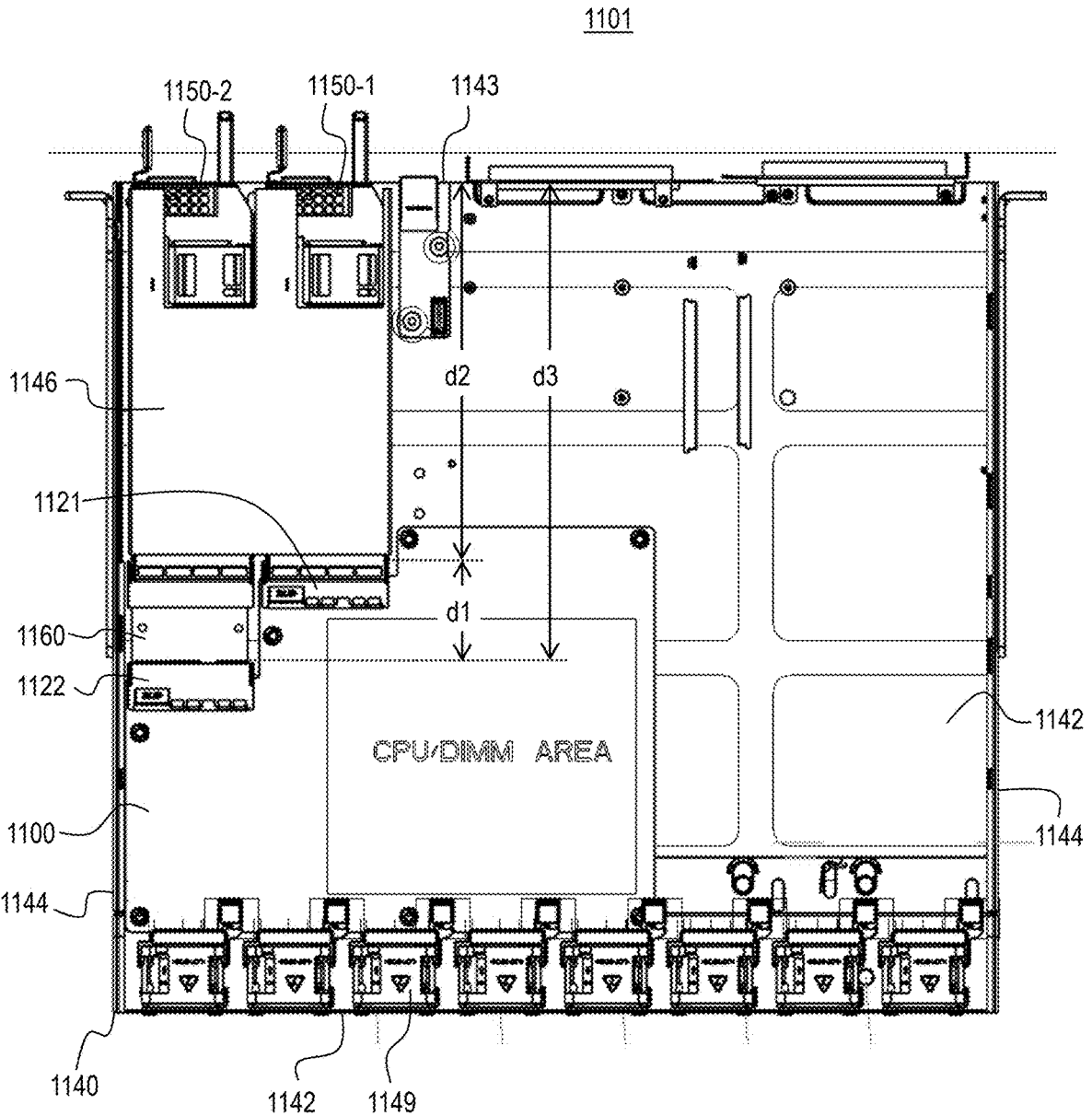
FIG. 6 is a top view of an example information processing system comprising the system board of FIG. 5.
Figure 7:
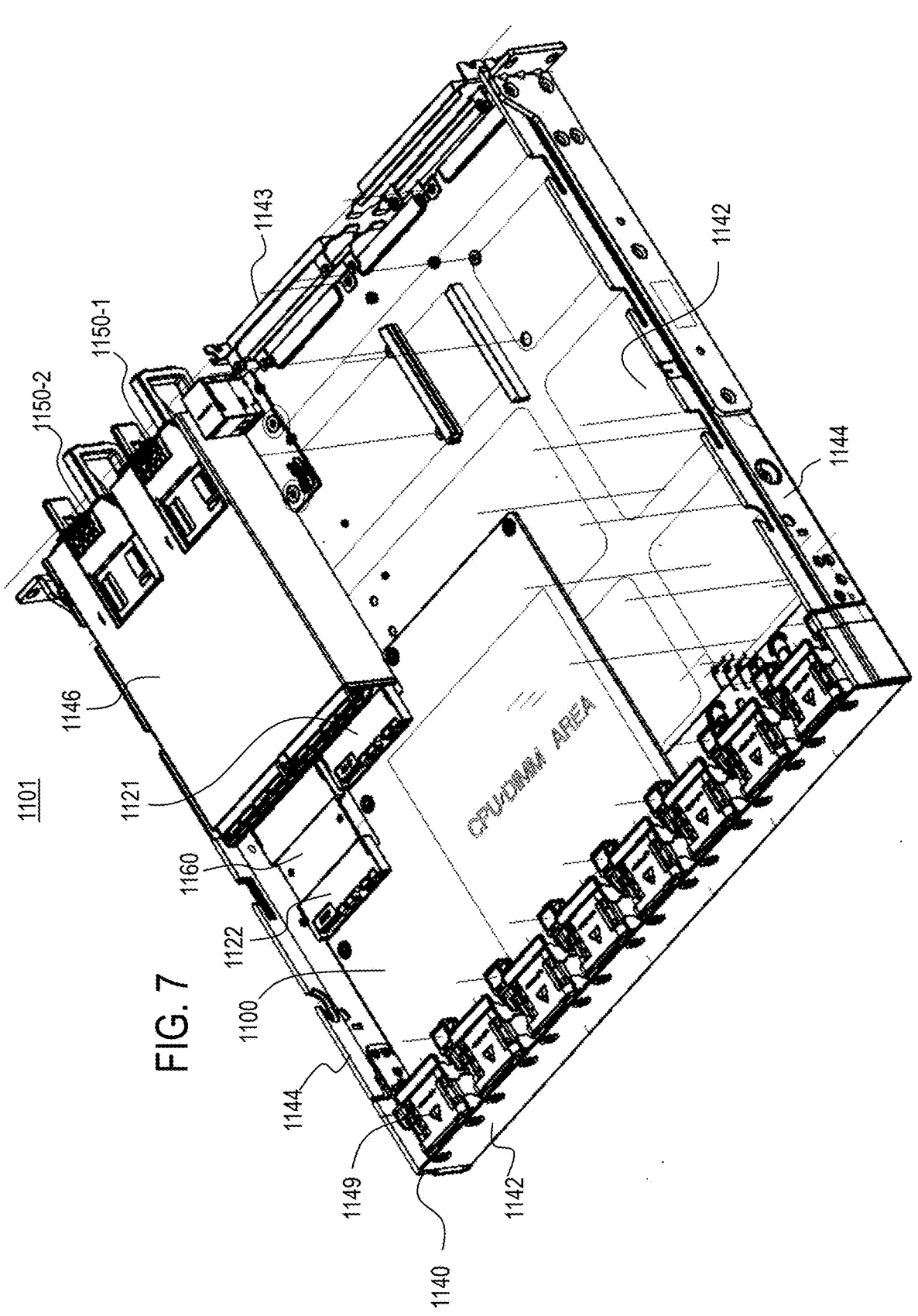
FIG. 7 is a perspective view of the information processing system of FIG. 6.
Figure 8:
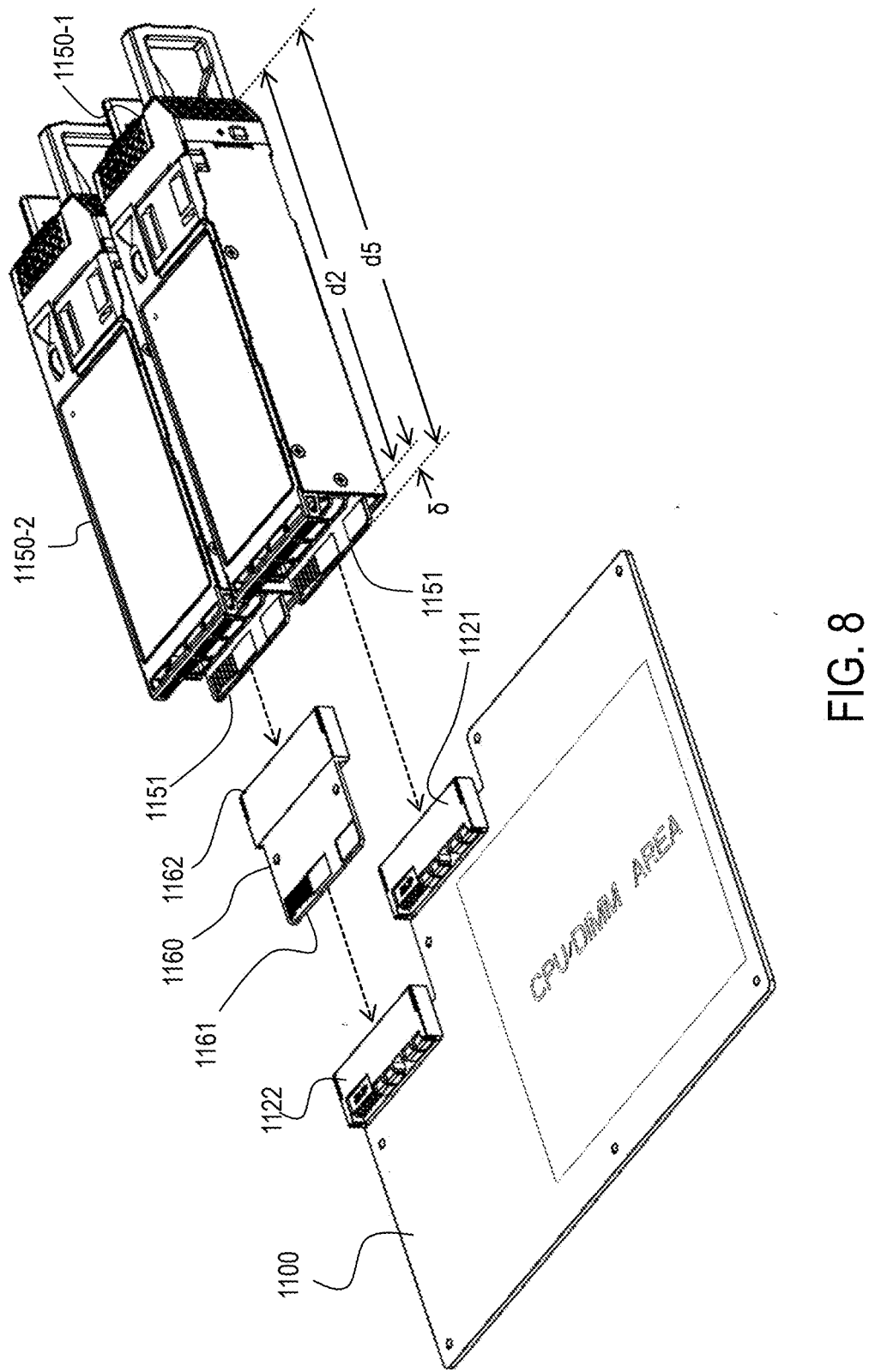
FIG. 8 is an exploded perspective view of a portion of the information processing system of FIG. 6.
Figure 11:
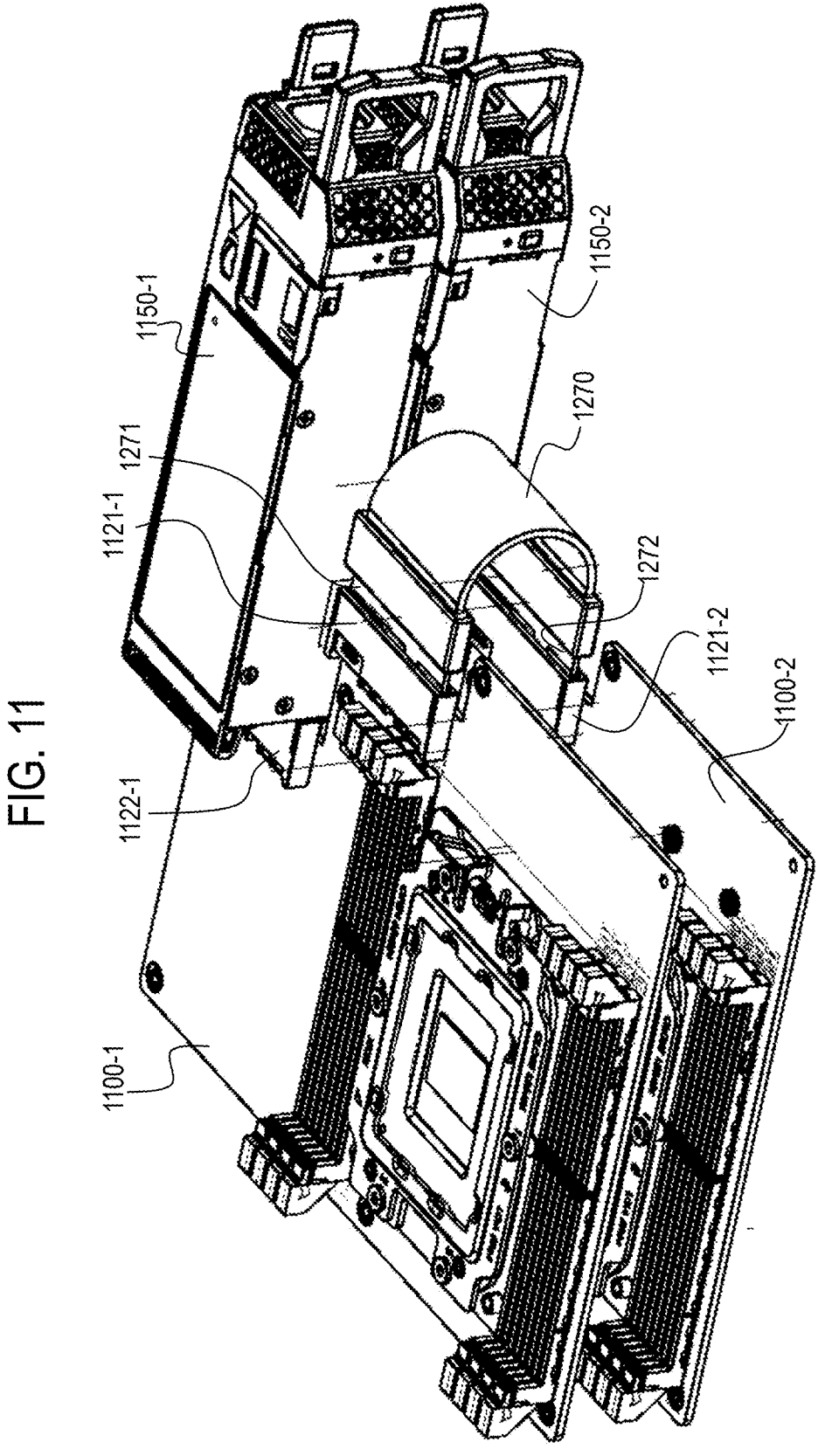
FIG. 11 is a perspective view of a portion of the information processing system of FIG. 9.
Figure 12:
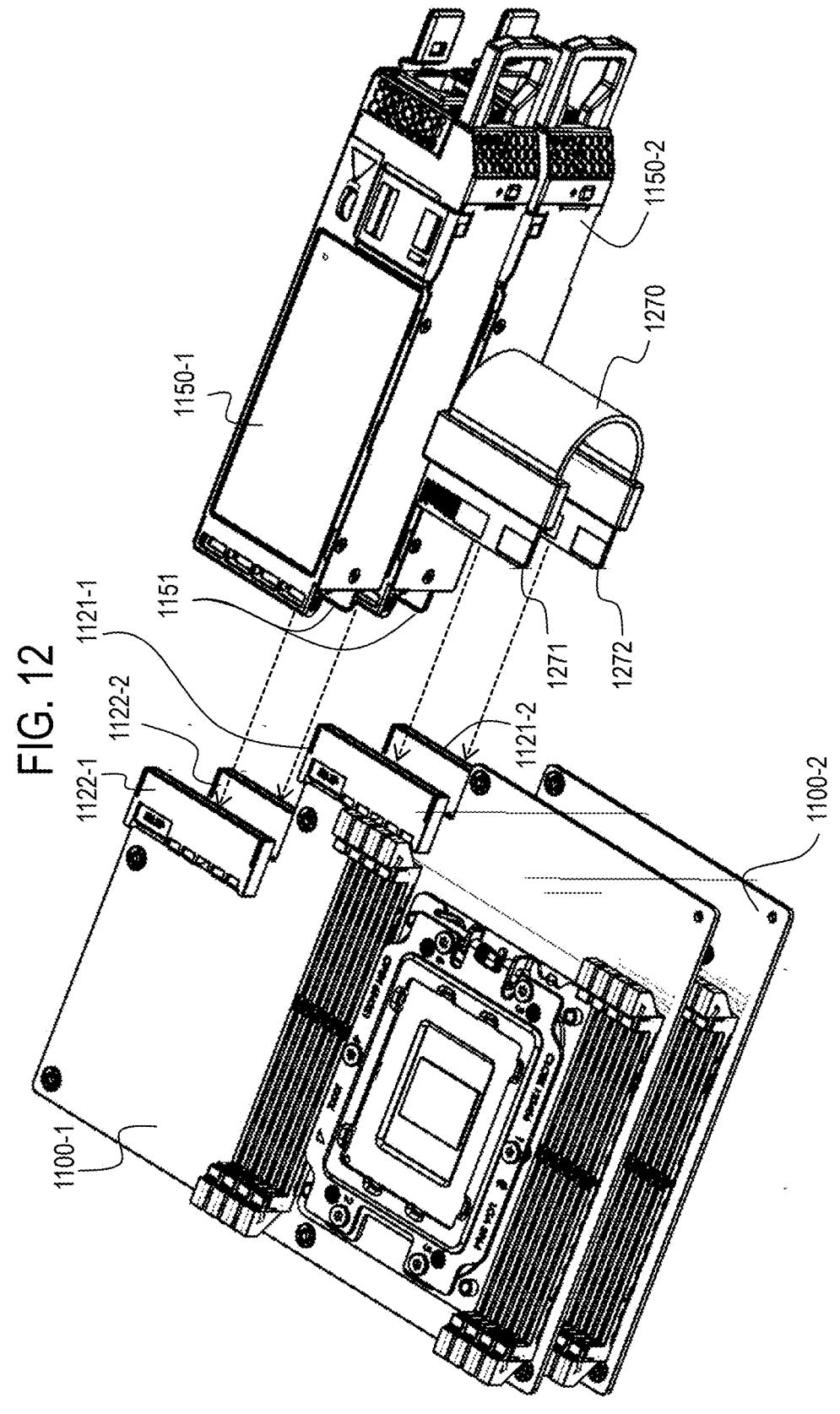
FIG. 12 is an exploded perspective view of the portion of the information processing system of FIG. 11.
Figure 13:
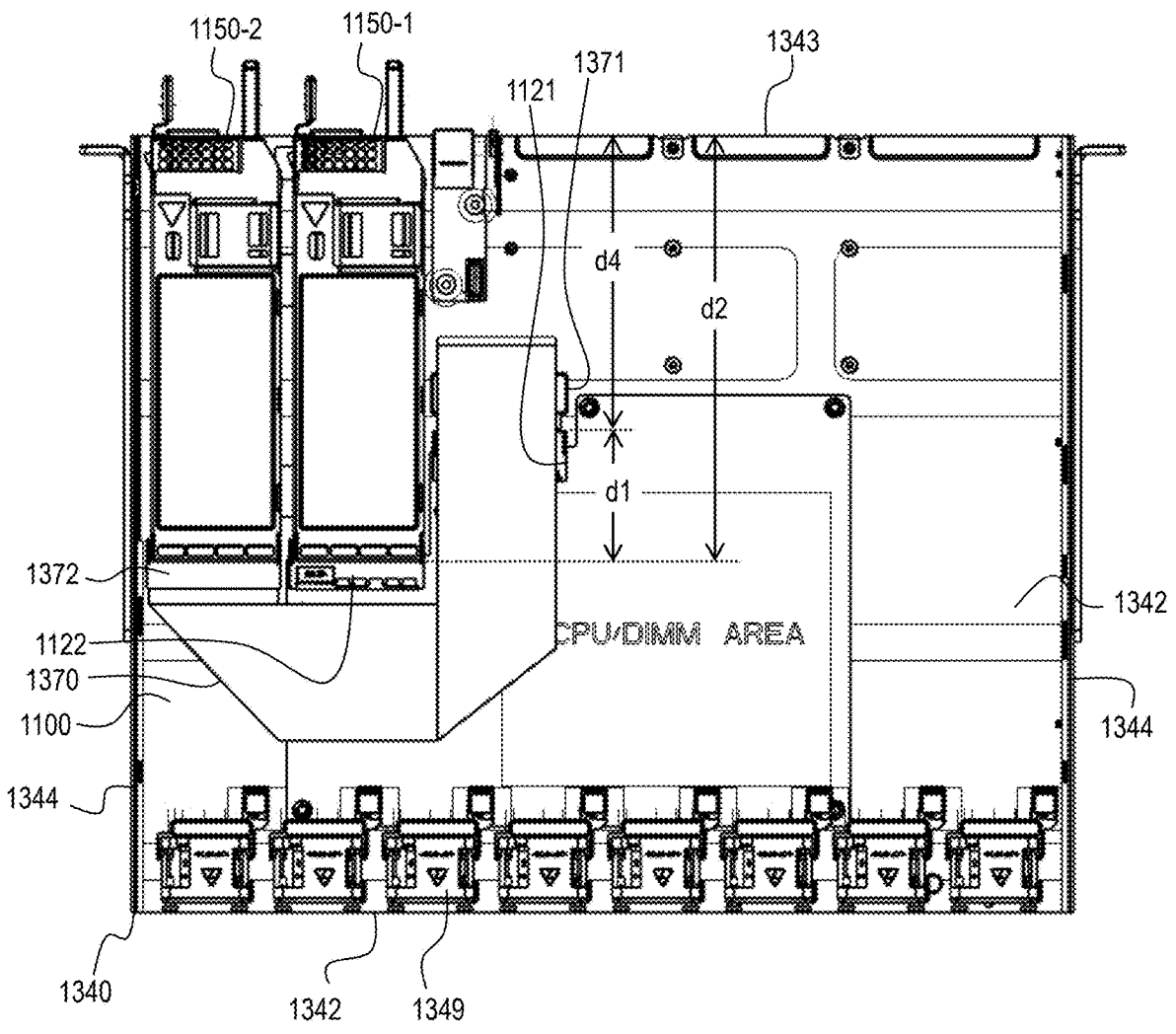
FIG. 13. is a top view of another example information processing system comprising the system board of FIG. 5.
Figure 14:
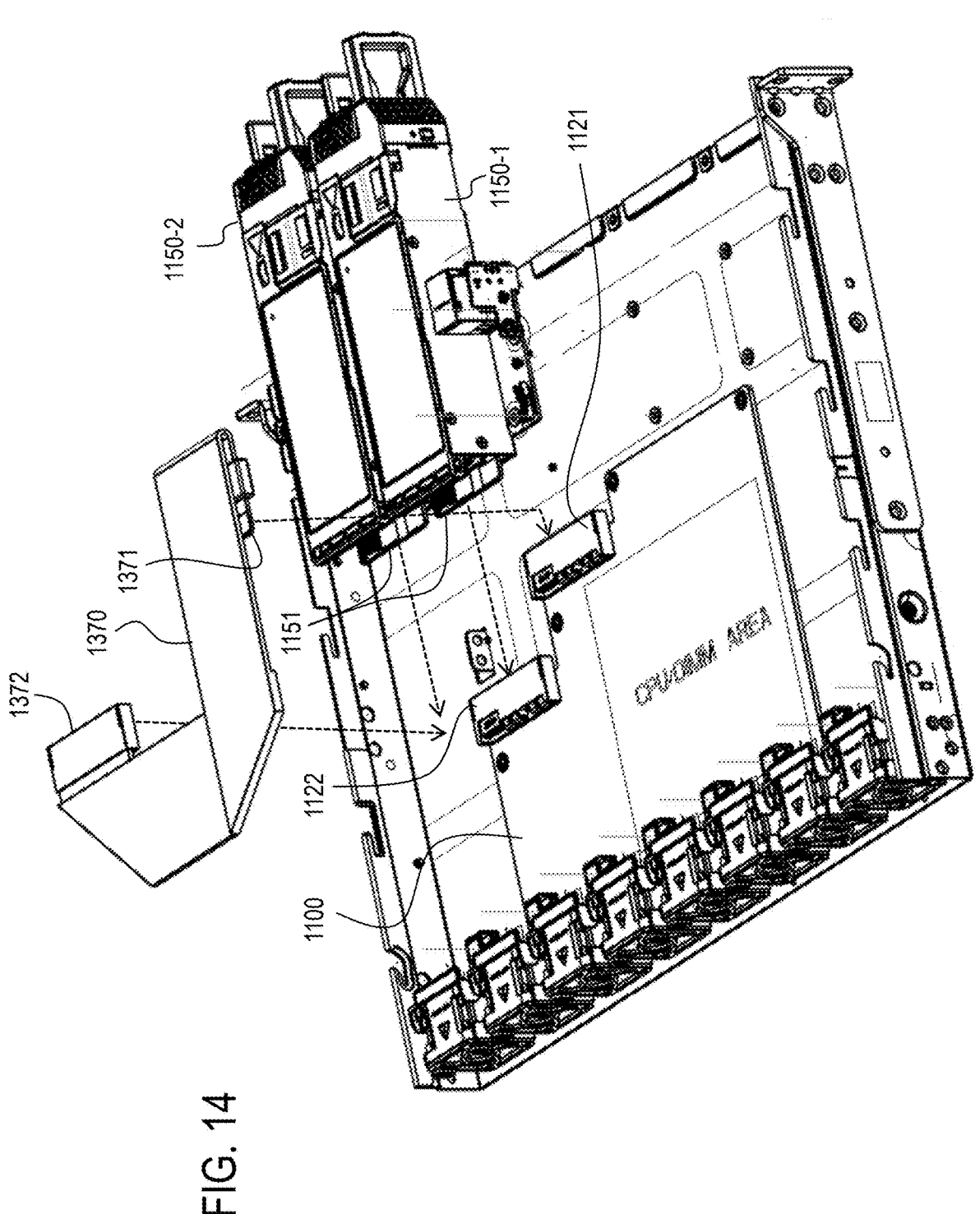
FIG. 14 is an exploded perspective view of the information processing system of FIG. 13.

Turning now to FIGS. 5-14, some example implementations of the system board 100 and the systems 101, 102, and 103 will be described. Specifically, FIG. 5 shows a system board 1100, which is one example implementation of the system board 100. Furthermore, FIGS. 6-8 show a system 1101 which is one example implementation of the system 101, FIGS. 9-12 show a system 1102 which is one example implementation of the system 102, and FIGS. 13 and 14 show a system 1103 which is one example implementation of the system 103. In FIGS. 5-13, components of the system board 1100 or systems 1101, 1102, or 1103 which correspond to (i.e., are example implementations of) components of the system board 100 or systems 101, 102, or 103 will be given similar reference numbers having the same last two digits, such as 121 and 1121.

As shown in FIG. 5, the system board 1100 comprises a PCB 1110 which has a stepped rear edge 1111. The stepped rear edge 1111 includes a rearmost portion 1111*a*, a first step 1111*b*, and a second step 1111*c*. The first step 1111*b* is offset forward of the rearmost portion 1111*a*, and the second step 1111*c* is offset forward of the first step 1111*b*.

The system board 1110 also comprises a first power connector 1121 and a second power connector 1122. The first power connector 1121 is mounted at the first step 1111*b*, and the second power connector 1122 is mounted at the second step 1111*c*. Thus, a rear edge of the second power connector 1122 is offset from a rear edge of the first connector 1121 by a distance d1. Both power connectors 1121 and 1122 are M-CRPS slot connectors in this example.

The system board also comprises electronic components 1130 including a processor socket 1131, among other components.

In some examples, system board may have a length (front to rear) of about 199 mm and a width (side to side) of about 260 mm. In some examples, a distance from a front edge of the PCB to the rear edge of the first connector 1121 may be about 182 mm. In some examples, the distance d1 may be about 60 mm.

As shown FIGS. 6-13, the system board 1100 can be used in a variety of systems having different sizes and configurations.

FIGS. 6-8 illustrate a first information processing system 1101, which is an example of the system 101. The information processing system 1101 comprises a chassis 1140, the system board 1100 installed in the chassis 1140, first and second PSUs 1150-1 and 1150-2 (collectively PSUs 1150), and an adapter board 1160.

The chassis 1140 may include a housing/enclosure which supports and houses the other components of the system 1101, as well as various internal support structures to support those components. Specifically, the chassis 1140 comprises a base 1141, a front panel 1142, and a rear panel 1143, two side walls 1144, and a cover (not illustrated), which together form a housing of the system.

As shown in FIGS. 6 and 7, the chassis 1140 also comprises a PSU cage 1146 which comprises two bays configured to removably receive and support the PSUs 1150, respectively. The PSU cage 1146 is disposed adjacent to the rear panel 1143 such that the PSUs 1150 are inserted through openings in the rear panel 1143 into the bays of the PSU cage 1146, and once the PSUs 1150 are so installed the rear sides of the PSUs 1150 become themselves part of the rear panel 1143 and are aligned with the rest of the rear panel 1143. (References to the rear side of the PSU 1150 being aligned with or flush to the rest of the rear panel 1143 refer to the perforated rear wall of the PSU 1150 being so aligned, and excludes various protruding portion of the PSU 1150, such as handles and release levers, which protrude beyond the rear wall of the PSU 1150).

As shown in FIG. 8, the PSUs 1150 each comprise a PSU edge connector 1151. This is a card-edge style of connector, which is formed in a protruding edge of a PCB of the PSU 1150. In this example, the PSU edge connector 1151 has an M-CRPS form factor. The cage 1146 comprises openings at a front end thereof through which the PSU edge connectors 1151 protrude when the PSUs 1150 are installed.

As shown in FIGS. 6 and 7, the system board 1100 is supported by the chassis 1140. Moreover, the system board 1100 is arranged in the chassis 1140 such that the first power connector 1121 is aligned with one bay of the PSU cage 1146 while the second power connector 1122 is aligned with another bay of the PSU cage 1146. Furthermore, as shown in FIG. 6, the first power connector 1121 is positioned a distance d2 from the rear panel 1143, whereas the second power connector 1122 is positioned a distance d3 from the rear panel 1143, wherein d3=d2+d1.

The distance d2 is approximately the same as the length of each of the PSUs 1150. More specifically, as shown in FIG. 8, each PSU 1150 may have a length of d5 which is substantially equal to d2+δ, where the "length" refers to the distance from the rear wall of the PSU 1150 (excluding protrusions such as handle, levers, etc.) to the front edge of the edge connector 1151, and where δ corresponds to the depth to which the edge connector 1151 is insertable into the slot of a power connector such as the power connector 1121. In other words, d2 corresponds to the length of the PSU 1150 excluding the insertion depth of the edge connector 1151.

Accordingly, when the first PSU 1150-1 is inserted into the PSU cage 1146, a PSU edge connector 1151 of the first PSU 1150-1 may mate directly with the first power connector 1121, as shown in FIGS. 6 and 7 and as suggested by the arrows in FIG. 8. In particular, the PSU edge connector 1151 of the first PSU 1150-1 blind-mates with the first power connector 1121 as the first PSU 1150-1 is inserted into the drive cage 1146. However, when the second PSU 1150-2 is inserted into the PSU cage 1146, a PSU edge connector 1151 of the second PSU 1150-2 cannot mate directly with the second power connector 1122, because the distance d3 exceeds the length d5 of the PSUs 1150. Thus, the adapter board 1160 may be interposed between the second power connector 1122 and the second PSU 1150-2, as shown in FIGS. 6-7.

As best seen in FIG. 8, the adapter board 1160 has an edge connector 1161 and a slot connector 1162. The edge connector 1161 of the adapter board 1160 has a form factor complementary to that of the second power connector 1122, while the slot connector 1162 has a form factor complementary to that of the PSU edge connector 1151. In this example, the edge connector 1161 and slot connector 1162 each have an M-CRPS form factor. As shown in FIG. 6, the adapter board 1160 is dimensioned such that, when the edge connector 1161 is mated with the second power connector 1122, the slot connector 1162 is the distance d2 from the rear panel 1143. In other words, the rear side of the slot connector 1162 is the distance d1 from the rear side of the second power connector 1122. Thus, the rear edge of the slot connector 1162 is aligned with rear edge of the first power connector 1121. Accordingly, the slot connector 1162 is positioned to be able to receive the PSU edge connector 1151 of the second PSU 1150-2. In other words, the adapter 1160 is able to span the gap between the second power connector 1122 and the PSU edge connector 1151. In some examples, the adapter board 1160 is attached to the chassis 1140 (e.g., to baseband 1142 or a bracket extending therefrom). This may make blind mating of the PSU edge connector 1151 of the second PSU 1150-2 with the socket connector 1162 easier.

The system 1101 may also include various other peripheral components, including a plurality of fans 1149. In addition, peripheral components such as data storage drives, expansion cards (e.g., GPUs), network interface cards (NICs), and the like may also be included in the system

1101, and these may be arranged in the spaces laterally adjacent to the system board 1100 and to the rear of the system board 1100. These components have been omitted from the views to simplify the description.

In some examples, the system 1101 may be configured as a 1 U 19-inch telecommunications server. 1 U refers to the height of the chassis 1140, with 1 U being 1 rack-unit. 19-inch refers to the system 1101 having a width that is compatible with use in a 19-inch rack, which is an industry standard rack size. Note that the width of the chassis 1140 may be less than 19 inches, as a bezel or "ears" may be added to the system 1101 to facilitate mounting to the racks. For example, in some implementations the chassis 1140 is about 445 mm in width. Telecommunications servers generally have different form factors than datacenter servers. In particular, they are often substantially shorter in length than a datacenter server, to allow for use in telecom racks which tend to have different dimensions than standard datacenter racks. In some examples, the system 1101 may be about 400 mm in length, from a front panel 1142 to a rear panel 1143. In contrast, a datacenter server may be on the order of 700 mm in length or more.

Turning to FIGS. 9-12, a second information processing system 1102 comprising the system board 1100 will be described. The system 1102 is an example implementation of the system 102. The information processing system 1102 comprises a chassis 240, two instances of the system board 1100 (i.e., system boards 1100-1 and 1100-2) installed in the chassis 240, two PSUs 1150, and a bridge 1270.

Figure 9:
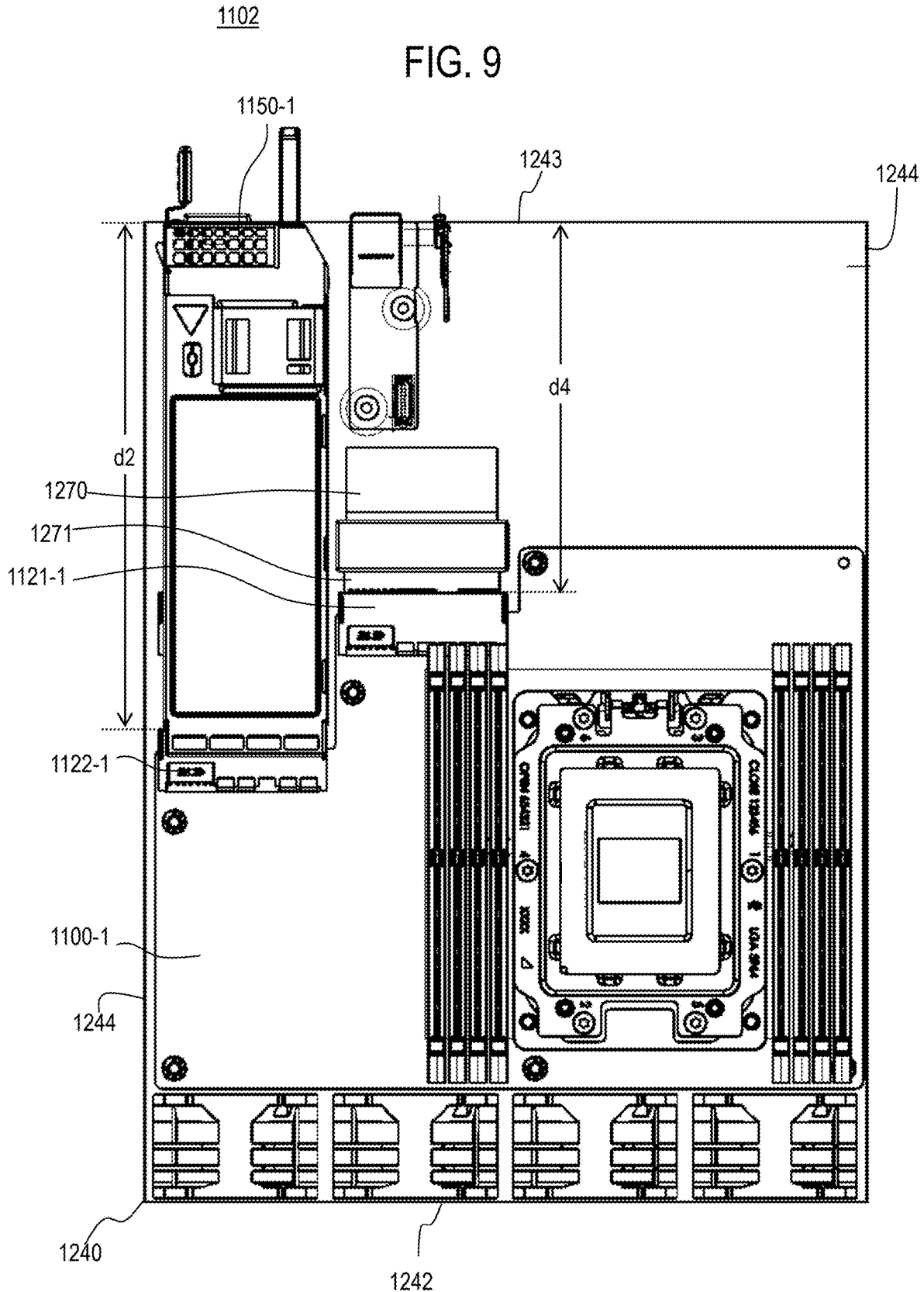
FIG. 9 is a top view of another example information processing system comprising the system board of FIG. 5.
Figure 10:
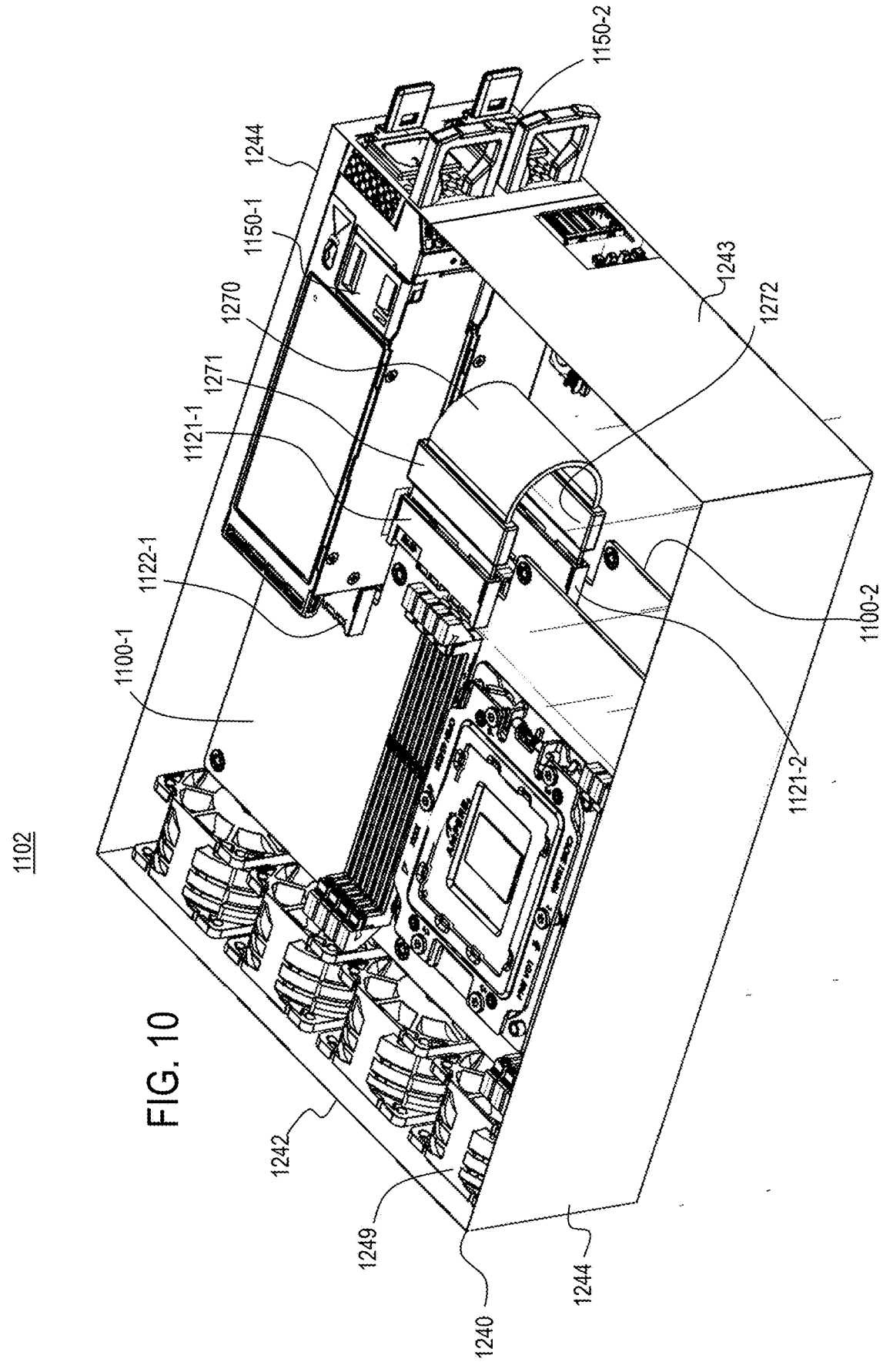
FIG. 10 is a perspective view of the information processing system of FIG. 9.

As shown in FIGS. 9 and 10, the chassis 1240 comprises a front panel 1242, a base 1241, a rear panel 1243, a cover (not illustrated), and side walls 1244. These components may be similar to the similarly named the components of the chassis 1140 described above, except that in some examples the chassis 1240 may be shorter in the front-to-rear direction than the chassis 1140. The chassis 1240 may also comprise a PSU cage, which is omitted from the view to allow visibility of the PSUs 1150.

The PSUs 1150 may be the same as the PSUs 1150 described above. In this example, the PSUs 1150-1 and 1150-2 are vertically stacked one atop the other, instead of being disposed horizontally adjacent to one another.

As best seen in FIGS. 10 and 12, the two system boards 1100 include a first system board 1100-1 and a second system board 1100-2. The system boards 1100-1 and 1100-2 may be identical to one another. In this example, the system boards 1100-1 and 1100-2 are vertically stacked atop one another within the chassis 1240. In this implementation, the chassis 240 may have a height of 2 U, with each system board 1100 having approximately 1 U of vertical space within the chassis allocated thereto. In some examples, the first power connector 1121-1 of the first system board 1101-1 is vertically aligned with the first power connector 1121-2 of the second system board 1101-2, whereas the second power connector 1122-1 of the first system board 1101-1 is vertically aligned with the second power connector 1122-2 of the second system board 1101-2.

In the second system 1102, the chassis 1240 is shorter than the chassis 1140, and therefore the rear panel 1243 is closer to the rear edges of the system boards 1100 than is the case in the system 1101. Thus, in the system 1102, instead of the first power connectors 1121 being the distance d2 from the rear panel 1243, the second power connectors 1122 are located the distance d2 from the rear panel 1243, as shown in FIG. 9. Accordingly, in this example, the PSUs 1150, which are approximately d2 in length, are able to mate directly with the second power connectors 1122. More specifically, the PSU edge connector 1151 of the first PSU 1150-1 mates with the second power connector 1122-1 of the system board 1100-1, while the PSU edge connector 1151 of the second PSU 1150-2 mates with the second power connector 1122-2 of the system board 1100-2, as partially shown in FIGS. 9-11 and as suggested by the arrows in FIG. 12. The second power connectors 1122-1 and 1122-2 are arranged relative to the bays which receive the PSUs 1150-1 and 1150-2 such that the PSU edge connector 1151 of the PSU 1150-1 and PSU 1150-2 can blind mate with the connectors 1122-1 and 1122-2, respectively, as the PSUs 1150 are inserted into the drive cage.

In this example, the first power connectors 1121-1 and 1121-2 are located a distance d4 from the rear panel 243, wherein d4 is less than d2. Thus, a PSU cannot mate directly with the first power connectors 1121. However, as shown in FIGS. 10 and 11, in this example, a bridge 1270 is mated to the first power connectors 1121 of the system boards 1100. As best seen in FIG. 12, the bridge 1270 comprises an edge connector 1271 at one end thereof, another edge connector 1272 at the opposite end thereof, and flexible wires connecting the edge connector 1271 to the edge connector 1272. The edge connector 1271 is mated with the first power connector 1121-1 of the first system board 1100-1, while the edge connector 1272 is mated with the first power connector 1121-2 of the second system board 1100-2. In this example, the system boards 1100 are vertically stacked and the first power connectors 1121-1 and 1121-2 are vertically aligned, and thus the bridge 1270 may extend vertically therebetween in the shape of a U or C. The edge connectors 1271 and 1272 may mimic the PSU edge connectors 1151 in form factor. Thus, in this example, the edge connectors 1271 and 1272 have an M-CRPS form factor.

By connecting the bridge 1270 to the first power connector 1121-1 and to the first power connector 1121-2, the power domains of the system boards 1100-1 and 1100-2 are unified into a single power domain. Thus, if one of the PSUs 1150 were to fail, the other PSU would be able to continue providing power to both of the system boards 1100-1 and 1100-2, ensuring full redundancy for the power supply.

The system 1102 may also include various other peripheral components, including a plurality of fans 1249. In addition, peripheral components such as data storage drives, expansion cards (e.g., GPUs), network interface cards (NICs), and the like may also be included in the system 1102, and these may be arranged in the spaces to the rear of the system boards 1100. These components have been omitted from the views to simplify the description.

In some examples, the system 1102 may be configured as a 2 U edge server. 2 U refers to the height of the chassis 1240, with 2 U being two rack-units. Rack servers generally have different form factors than datacenter servers and telecom servers. In particular, they are often substantially shorter in length than a datacenter server, and may also be slightly shorter in length than telecom servers. These difference in form factor may stem from differences in how the servers are to be deployed. Often, datacenter and telecom servers are deployed in various industry standard racks, whereas edge servers may be deployed in less conventional locations, such as mounted to walls or ceilings, in cabinets or drawings, etc., or may be deployed in smaller racks. In some examples, the system 1102 may be about 350 mm in length, from front panel 1242 to rear panel 1243. In some examples, the system 1102 may be about 265 mm in width, from side panel 1244 to side panel 1244.

Turning now to FIGS. 13 and 14, a third information processing system 1103 comprising the system board 1100 will be described. The system 1103 is an example implementation of the system 103. The information processing system 1103 comprises a chassis 1340, the system board 1100 installed in the chassis 340, two PSUs 1150, and a bridge 1370.

The chassis 1340 comprises a front panel 1342, a base 1341, a rear panel 1343, a cover (not illustrated), and side walls 1344. The chassis 1340 may also comprise a PSU cage (not illustrated). These components may be similar to the similarly named the components of the chassis 1140 described above, except that in some examples the chassis 1340 may be shorter in the front-to-rear direction than the chassis 1140. Furthermore, in some examples, the chassis 1340 can be wider than the chassis 1240.

The PSUs 1150 may be the same as the PSUs 1150 described above.

This example system 1103 may be similar to the system 1102 of FIG. 9 in that the rear panel 1343 is closer to the rear edge 1111 of the system board 1100 than is the case in the system 1101, and therefore in the system 1103 the second power connector 1122 is the distance d2 from the rear panel 1343, and the first power connector 1121 is the distance d4<d2 from the rear panel 1343, as shown in FIG. 13. Accordingly, like with the system 1102, in the system 1103 the PSUs 1150 cannot be directly connected to the first power connector 1121 and instead the first PSU 1150-1 is connected directly to the second power connector 1122, as shown in FIG. 13. In particular, the second power connector 1122 may be arranged relative to a bay which receives the first PSU 1150-1 such that the PSU edge connector 1151 of the first PSU 1150-1 can blind-mate with the second power connector 1122 as the first PSU 1150-1 is inserted into the drive cage.

Unlike the system 1102, in the system 1103 there are not two system boards 1100 and therefore the second PSU 1150-2 is not connected directly to another system board 1100. Instead, as shown in FIG. 13, the second PSU 1150-2 is connected to a bridge 1370, which is in turn connected to the system board 1100. As best seen in FIG. 14, the bridge 1370 comprises an edge connector 1371 at one end, a slot connector 1372 at the opposite end, and flexible wires connecting the edge connector 1371 and slot connector 1372 together. As shown in FIG. 13 and as suggested by the arrows in FIG. 14, the edge connector 1371 is connected to first power connector 1121 of system board 1100, while the slot connector 1372 is connected to the PSU edge connector 1151 of the second PSU 1150-2. The edge connector 1371 may mimic the PSU edge connectors 1151 in form factor, while the slot connector 1372 may mimic the first and second power connectors 1121 and 1122 in form factor. Thus, in this example, the connectors 1371 and 1372 may have an M-CRPS form factor.

In some examples, the slot connector 1372 may be attached to the chassis 1340 (e.g., to baseman 1342) in position adjacent to the second power connector 1122 and aligned with a bay which will receive the second PSU 1150-2 so as to allow for blind mating to occur between the PSU edge connector 1151 of the second PSU 1150-2 and the slot connector 1372.

The system 1103 may also include various other peripheral components, including a plurality of fans 1349. In addition, peripheral components such as data storage drives, expansion cards (e.g., GPUs), network interface cards (NICs), and the like may also be included in the system 1103, and these may be arranged in the spaces laterally adjacent to and/or to the rear of the system board 1100. These components have been omitted from the views to simplify the description.

In some examples, the system 1103 may be configured as a 1 U edge server. 1 U refers to the height of the chassis 1240, with 1 U being one rack-unit. In some examples, the system 1103 may be about 350 mm in length, from front panel 1342 to rear panel 1343. In some examples, the system 1103 may greater than 265 mm in width, from side panel 1244 to side panel 1244—in some examples, the width may be about 440 mm.

It is to be understood that both the general description and the detailed description provide examples that are explanatory in nature and are intended to provide an understanding of the present disclosure without limiting the scope of the present disclosure. Various mechanical, compositional, structural, electronic, and operational changes may be made without departing from the scope of this description and the claims. In some instances, well-known circuits, structures, and techniques have not been shown or described in detail in order not to obscure the examples. Like numbers in two or more figures represent the same or similar elements.

In addition, the singular forms "a", "an", and "the" are intended to include the plural forms as well, unless the context indicates otherwise. Moreover, the terms "comprises", "comprising", "includes", and the like specify the presence of stated features, steps, operations, elements, and/or components but do not preclude the presence or addition of one or more other features, steps, operations, elements, components, and/or groups. Components described as coupled may be electronically or mechanically directly coupled, or they may be indirectly coupled via one or more intermediate components, unless specifically noted otherwise. Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Elements and their associated aspects that are described in detail with reference to one example may, whenever practical, be included in other examples in which they are not specifically shown or described. For example, if an element is described in detail with reference to one example and is not described with reference to a second example, the element may nevertheless be claimed as included in the second example.

Unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within ±1% of the stated value, property, or relationship unless indicated otherwise.

Further modifications and alternative examples will be apparent to those of ordinary skill in the art in view of the disclosure herein. For example, the devices and methods may include additional components or steps that were omitted from the diagrams and description for clarity of operation. Accordingly, this description is to be construed as illustrative only and is for the purpose of teaching those skilled in the art the general manner of carrying out the present teachings. It is to be understood that the various examples shown and described herein are to be taken as exemplary. Elements and materials, and arrangements of those elements and materials, may be substituted for those illustrated and described herein, parts and processes may be reversed, and certain features of the present teachings may be utilized independently, all as would be apparent to one skilled in the art after having the benefit of the description herein. Changes may be made in the elements described herein without departing from the scope of the present teachings and following claims.

It is to be understood that the particular examples set forth herein are non-limiting, and modifications to structure, dimensions, materials, and methodologies may be made without departing from the scope of the present teachings.

Other examples in accordance with the present disclosure will be apparent to those skilled in the art from consideration of the specification and practice of the invention disclosed herein. It is intended that the specification and examples be considered as exemplary only, with the following claims being entitled to their fullest breadth, including equivalents, under the applicable law.

What is claimed is:

1. A system board for an information processing device, comprising:
   a printed circuit board (PCB) having a stepped rear edge comprising at least first step and a second step, the first step being farther rearward than the second step;
   electronic components, including a processor socket, formed in and/or mounted to the PCB;
   a first power connector mounted to the PCB at the first step; and
   a second power connector mounted to the PCB at the second step such that the first power connector is a predetermined distance farther rearward than the second power connector.

2. The system board of claim 1, wherein the first power connector and the second power connector each comprise an M-CRPS slot connector.

3. The system board of claim 1,
   wherein the system board is configured to be compatible with a first system having a first length and a second system having a second length, the first and second system each comprising PSUs having a same form factor.

4. The system board of claim 3,
   wherein the first power connector is positioned such that, on condition of the system board being installed in the first system, a distance from a first rear panel of the first system to the first power connector is equal to a length of one of the PSUs less an insertion depth of a PSU edge connector of the PSU in the first power connector; and
   wherein the second power connector is positioned such that, on condition of the system board being installed in the second system, a distance from a second rear panel of the second system to the second power connector is equal to the length of one of the PSUs less the insertion depth of the PSU edge connector.

5. The system board of claim 1, wherein the predetermined distance is 60 mm.

6. An information processing system comprising:

the system board of claim 1;

a chassis supporting the system board;

a first PSU and a second PSU, each comprising a PSU edge connector; and an adapter board comprising an edge connector and a slot connector, wherein the PSU edge connector of the first PSU is mated directly with the first power connector of the system board, the edge connector of the adapter board is mated directly with the second power connector of the system board, and the PSU edge connector of the second PSU is mated directly with the slot connector of the adapter board.

7. The system of claim 6, wherein the chassis comprises a rear panel and a power supply unit (PSU) cage at the rear panel, wherein each of the PSUs is installed in the PSU cage, wherein the first power connector is aligned with a first bay of the PSU cage such that the PSU edge connector of the first PSU blind mates with the first power connector during insertion of the first PSU into the PSU cage, and wherein the second power connector is aligned with a second bay of the PSU cage.

8. The system of claim 7, wherein the adapter is affixed to the chassis and aligned with the second bay of the PSU cage such that the PSU edge connector of the second PSU blind mates with the slot connector of the adapter during insertion of the second PSU into the PSU cage.

9. The system of claim 6, wherein the chassis comprises a front panel and a rear panel, and a length of the chassis from the front panel to the rear panel is 400 mm.

10. The system of claim 6, wherein the first power connector, the second power connector, and the slot connector of the adapter board each comprise M-CRPS slot connectors, and wherein the edge connector of the adapter board and the PSU edge connectors of the first and second PSUs each comprise M-CRPS edge connectors.

11. An information processing system comprising:

a first system board comprising an instance of the system board of claim 1;

a second system board comprising another instance of the system board of claim 1;

a chassis supporting the first and second system boards;

a first PSU and a second PSU, each comprising a PSU edge connector; and an adapter bridge comprising a first edge connector and a second edge connector, wherein the PSU edge connector of the first PSU is mated directly with the second power connector of the first system board, wherein the PSU edge connector of the second PSU is mated directly with the second power connector of the second system board, wherein the first edge connector of the adapter bridge is mated directly with the first power connector of the first system board, and the second edge connector of the adapter bridge is mated directly with the first power connector of the second system board.

12. The system of claim 11, wherein the first system board is vertically stacked above the second system board, wherein the first power connector of the first system board is vertically aligned with the first power connector of the second system board, and wherein the second power connector of the first system board is vertically aligned with the second power connector of the second system board.

13. The system of claim 12, wherein the chassis comprises a rear panel and a power supply unit (PSU) cage at the rear panel, wherein each of the first and second PSUs is installed in the PSU cage, wherein the first power connectors of the first and second system boards are aligned, respectively, with the bays of the PSU cage such that the PSU edge connectors of the first and second PSUs blind mate with the first power connectors of the first and second system boards, respectively, during insertion of the first and second PSUs into the PSU cage.

14. The system of claim 11, wherein the adapter bridge comprises flexible wires connecting the first edge connector to the second edge connector.

15. The system of claim 11, wherein the chassis comprises a front panel and a rear panel, and a length of the chassis from the front panel to the rear panel is 350 mm.

16. The system of claim 11, wherein the first power connector and the second power connector each comprise M-CRPS slot connectors, and wherein the first edge connector and second edge connector of the adapter bridge and the PSU edge connectors of the first and second PSUs each comprise M-CRPS edge connectors.

17. An information processing system comprising:

the system board of claim 1;

a chassis supporting the system board;

a first PSU and a second PSU, each comprising a PSU edge connector; and an adapter bridge comprising an edge connector and a slot connector, wherein the PSU edge connector of the first PSU is mated directly with the second power connector of the system board, wherein the PSU edge connector of the second PSU is mated directly with the slot connector of the adapter bridge, wherein the edge connector of the adapter bridge is mated directly with the first power connector of the system board, and the PSU edge connector of the second PSU is mated directly with the slot connector of the adapter bridge.

18. The system of claim 17, wherein the chassis comprises a rear panel and a power supply unit (PSU) cage at the rear panel, wherein each of the first and second PSUs is installed in the PSU cage, wherein the second power connector of the system board is aligned with a first bay of the PSU cage such that the PSU edge connector of the first PSU blind mates with the second power connector during insertion of the first PSU into the first bay, and wherein the slot connector of the adapter bridge is affixed to the chassis in alignment with a second bay of the PSU cage such that the PSU edge connector of the second PSU blind mates with the slot connector during insertion of the second PSU into the second bay.

19. The system of claim 17, wherein the adapter bridge comprises flexible wires connecting the edge connector to the slot connector.

20. The system of claim 17, wherein the first power connector, the second power connector, and the slot connector each comprise M-CRPS slot connectors, and wherein first edge connector of the adapter bridge and the PSU edge connectors of the first and second PSUs each comprise M-CRPS edge connectors.

\* \* \* \* \*